United States Patent [19]

Furukawa

[11] Patent Number: 5,695,908
[45] Date of Patent: Dec. 9, 1997

[54] PROCESS FOR PREPARING PRINTING PLATE

[75] Inventor: Akira Furukawa, Tokyo, Japan

[73] Assignee: Mitsubishi Paper Mills, Limited, Tokyo, Japan

[21] Appl. No.: 577,669

[22] Filed: Dec. 22, 1995

[30] Foreign Application Priority Data

Dec. 27, 1994 [JP] Japan ................................. 6-325963
Dec. 27, 1994 [JP] Japan ................................. 6-325965

[51] Int. Cl.$^6$ .................. G03C 8/26; G03C 8/28; G03F 7/07; B05D 3/00
[52] U.S. Cl. .................. 430/205; 430/202; 430/204; 430/232; 430/247; 101/466; 347/96; 427/273; 525/326.7; 525/328.2; 525/371; 525/370
[58] Field of Search .................. 430/202, 204, 430/205, 247, 232; 347/96; 101/466; 427/273; 525/326.7, 328.2, 371, 370

[56] References Cited

U.S. PATENT DOCUMENTS

| | | | |
|---|---|---|---|
| 3,194,661 | 7/1965 | Cohen | 430/202 |
| 3,250,616 | 5/1966 | Haydn et al. | 430/204 |
| 3,345,164 | 10/1967 | Cohen et al. | 430/247 |
| 4,060,417 | 11/1977 | Cieciuch et al. | 430/214 |
| 4,425,420 | 1/1984 | De Jaeger | 430/204 |
| 4,694,302 | 9/1987 | Hackleman et al. | 347/96 |
| 5,273,858 | 12/1993 | Coppens | 430/204 |
| 5,362,602 | 11/1994 | Coppens | 430/262 |
| 5,466,653 | 11/1995 | Ma et al. | 427/273 |
| 5,501,150 | 3/1996 | Leenders et al. | 430/204 |

FOREIGN PATENT DOCUMENTS

| | | |
|---|---|---|
| 48-30562 | 9/1973 | Japan . |
| 51-15765 | 5/1976 | Japan . |
| 51-111103 | 10/1976 | Japan . |
| 52-150105 | 12/1977 | Japan . |
| 57-158844 | 9/1982 | Japan . |
| 4-282296 | 10/1992 | Japan . |

OTHER PUBLICATIONS

Andre Rott, Dipl Ing and Edith Weyde, Dr Ing, Photographic Silver Halide Diffusion Processes, 1972, pp. 101–107.

*Primary Examiner*—Richard L. Schilling
*Attorney, Agent, or Firm*—Cushman Darby & Cushman IP Group of Pillsbury Madison & Sutro LLP

[57] ABSTRACT

There are disclosed a process for preparing a printing plate which comprises the steps of providing, on a support, a layer containing a water-soluble polymer which becomes water-insoluble by a metal ion, and feeding the metal ion image-wise from the surface of the layer to form an image pattern comprising the hardened water-soluble polymer on the support, and a plate for preparing a printing plate which comprises a support and a layer containing a water-soluble polymer which becomes water-insoluble in contact with a metal ion provided on the surface of the support.

9 Claims, No Drawings

PROCESS FOR PREPARING PRINTING PLATE

BACKGROUND OF THE INVENTION

1. Field of the Invention

This invention relates to a novel process for preparing a printing plate, particularly to a process for preparing a printing plate having excellent printing characteristics and high quality simply and easily.

2. Prior Art

As a process for preparing a printing plate, there have been known various processes in the prior art. For example, it has been well known that a resin relief printing plate utilizing a photosensitive resin and a lithographic printing plate which is called a PS plate have been used widely in various fields. As a problem concerned in the photosensitive resin, there is a problem of improvement in sensitivity, and a photosensitive resin having sensitivity with laser exposure is being developed for the purpose of direct plate making. However, under the present circumstances, for example, a photosensitive material having high sensitivity equivalent to that of a silver complex photograph has not yet been put into practical use.

On the other hand, as a system for preparing a printing plate utilizing an electrophotographic system, there has been practiced a process for preparing a lithographic printing plate, in which a layer comprising zinc oxide, cadmium sulfide or an organic photoconductive material (OPC) and various kinds of binders is formed on a support, and after electrification, exposure and toner development, non-image portions are made hydrophilic by an etching step to make toner image portions ink receptive. However, its process until a printing plate is obtained is complicated, and in order to obtain a printing plate of high quality stably, extremely strict maintenance and control of an apparatus are required.

As a system for preparing a lithographic printing plate to which a silver complex photographic system is applied, there has been widely practiced a system in which a silver image is formed by a silver complex diffusion transfer process, and by utilizing ink receptivity of the surface of the silver image, offset printing is carried out. With respect to the lithographic printing plate utilizing the silver complex diffusion transfer process (DTR process), some examples thereof are described in André Rott and Edith Weyde, "Photographic Silver Halide Diffusion Processes", pp. 101 to 103, published by the Focal Press, London and New York (1972).

As described therein, there have been known two types of lithographic printing plates utilizing the DTR process, i.e., a two sheet type lithographic printing plate in which a transfer material and an image-receiving material are separated and a mono-sheet type lithographic printing plate in which both materials are provided on one support. The two sheet type lithographic printing plate is described in detail in Japanese Provisional Patent Publication No. 158844/1982. The mono-sheet type lithographic printing plate is described in detail in, for example, Japanese Patent Publications No. 30562/1973 and No. 15765/1976 and Japanese Provisional Patent Publications No. 111103/1976 and No. 150105/1977.

A lithographic printing plate utilizing the silver complex diffusion transfer process comprises greasy ink receptive oleophilic image portions and ink repellent oleophobic non-image portions, the latter being generally water receptive hydrophilic areas. Accordingly, the customary lithographic printing is carried out by feeding both water and colored ink to the printing plate surface to allow the image portions to receive preferentially the colored ink and the non-image portions preferentially water and then transfer-ring the ink deposited on image portions onto a substrate such as paper for example. In order to obtain a print of good quality, therefore, it is necessary that oleophilic activity of the image portions and hydrophilicity of the non-image portions may completely repel the ink.

In the process for preparing a printing plate as described above, exposure by light is required on image formation, strict selection of a material for improving sensitivity is required, and also a complicated optical system is generally required so that an apparatus is necessarily expensive and large-scaled under the present circumstances. As compared with the image formation process as described above, in an ink jet recording system which has been spread rapidly in recent years, a complicated optical system is not required, good recording can be carried out by a means having an extremely compact size, and also an image can be formed merely by scattering ink on a recording medium. Therefore, it is not necessary to carry out developing treatment which is necessary in other recording system (a printing plate-forming system) as described above, and a waste accompanied with recording is not generated so that the ink jet recording system is an extremely predominant image formation process. Therefore, there have been proposed various attempts to apply such an ink jet recording system to preparation of a printing plate, but an effective process has not yet been found under the present circumstances.

In a printing plate, particularly a lithographic printing plate, selection of a support is an extremely important factor. By forming an ink receptive-image layer on an aluminum plate subjected to graining treatment as used in a PS plate, there is formed a printing plate by which non-image portions have sufficiently high hydrophilicity, less toning (scum) on printing occurs and press life is good. Therefore, such a support is suitable particularly when a large number of sheets are required to be printed and a high quality printing level is required. A lithographic printing plate of a silver complex system using an aluminum plate as a support is described in detail in, for example, U.S. Pat. Nos. 4,335,197, 4,425,420, 5,068,165 and 5,213,943. In these patents, there has been described in detail a mono-sheet type lithographic printing plate utilizing the DTR process, in which a roughened and anodized aluminum plate is used as a support, physical development nuclei are carried on the support, and a photosensitive silver halide emulsion layer is further provided as an upper layer. In these patents, disclosed is a process for preparing a printing plate by subjecting the above lithographic printing plate to imagewise exposure and DTR development and then removing the silver halide emulsion layer by washing with warm water. The portion having ink receptivity in lithographic printing is a metallic silver image formed on the aluminum plate, and the process is not satisfactory in the points of image quality, ink receptivity and press life of the transferred silver image.

On the other hand, there has been employed a process in which paper or a film is used as an inexpensive support, and a layer forming non-image portions having hydrophilic surfaces and an image layer having ink receptivity are formed on the surface of the paper or film. For example, in a system utilizing the above electrophotographic system and utilizing zinc oxide or the like as a photosensitive material, there is employed a system in which a toner image is utilized as an ink receptive layer and non-image portions are changed so as to have surfaces having high water retentivity by suitable treatment for imparting hydrophilicity (etching treatment). Further, in a process for preparing a printing plate according to the silver complex diffusion transfer process, there is employed a system in which a surface layer comprising a resin or the like having high hydrophilicity is previously formed, and a silver image having ink receptivity is formed on the surface layer to prepare a printing plate.

A process in which a printing plate is prepared by forming a material having photosensitivity on a support, and generally through complicated steps as described above is a means which has been used in the prior art. In recent years, accompanied with the increment in amounts of information, it has been strongly demanded to treat information rapidly and also desired to shorten a plate making time and to make a plate making apparatus more inexpensive and lower the price of a printing plate itself under the present circumstances.

In all of the conventional processes for preparing a printing plate as described above, photosensitivity of a printing plate itself is required, whereby it is extremely difficult to keep a balance between photosensitive characteristics such as improvement in sensitivity and characteristics required as a printing plate. Further, an expensive material having high photosensitivity is generally used as such as a printing plate, whereby a plate making cost is necessarily expensive.

SUMMARY OF THE INVENTION

An object of the present invention is to provide a system in which a material having no photosensitivity is used as a printing plate, and an image having good press life and high quality is formed on a support simply and easily.

Another object of the present invention is to provide a lithographic printing plate having good ink receptivity, good press life and high sensitivity, by which an image having high quality is formed on a support simply and easily.

The objects of the present invention can be achieved by the following process. That is, a process for preparing a printing plate of the present invention comprises the steps of providing, on a support, a layer containing a water-soluble polymer which becomes water-insoluble by a metal ion, and feeding the metal ion imagewisely from the surface of the layer to form an image pattern comprising the water-insoluble polymer on the support.

Also, a plate for preparing a printing plate of the present invention comprises a support and a layer containing a water-soluble polymer which becomes water-insoluble in contact with a metal ion to form an image pattern provided on the surface of the support.

DESCRIPTION OF THE PREFERRED EMBODIMENTS

In the following, the present invention is explained in detail.

In the constitution described above, the water-soluble polymer is not particularly limited so long as it has a characteristic of being curable by adding metal ions. The characteristic of water-solubility itself is necessary only because there is an effect of heightening permeability of metal ions when metal ions are diffused in the water-soluble polymer. There is no problem even if the polymer is dissolved in, for example, an alkaline or acidic aqueous solution and has poor solubility in a neutral aqueous solution.

The characteristic that the polymer is cured or hardened without heating, i.e., becomes water-insoluble in contact with metal ions is exhibited when the polymer has a functional group which strongly interacts with metal ions, and in a large number of examples of the so-called known chelate-forming polymers, such phenomenon has been observed. Among the generally known chelate-forming polymers, there are many polymers which form a chelate, but are neither cured nor insolubilized. Further, in some cases, even when the polymer is cured, the degree of curing is weak and water resistance is poor so that the polymer cannot be used for forming an image.

As an extremely preferred embodiment of using the water-soluble polymer which is cured by metal ions and forms a cured film having sufficient water resistance, there may be mentioned a process in which a layer containing a water-soluble polymer having a functional group represented by the formula (A) or (B) shown below is provided, the water-soluble polymer is cured by feeding metal ions imagewisely from the surface of the layer, and the water-soluble polymer at the uncured portions is dissolved and removed to form an image pattern comprising the water-soluble polymer cured by chelate formation, on a support. By such a process, the desired printing plate is prepared.

wherein $R^1$ represents a hydrogen atom, an alkyl group, an aryl group, an amino group or an amidino group; and $R^2$ represents a hydrogen atom or an amino group.

wherein X represents a nitrogen-containing heterocyclic ring; and n represents an integer of 1 or 2.

Preferred examples of the water-soluble polymer having the functional group represented by the above formula (A) include a water-soluble polymer having a structural unit represented by the following formula (A-1):

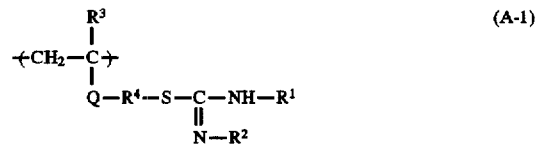

wherein $R^3$ represents a hydrogen atom or a lower alkyl group having 1 to 6 carbon atoms; Q represents a divalent linking group; $R^4$ represents a divalent linking group or a direct bonding arm (single bond); and $R^1$ and $R^2$ have the same meanings defined above.

Preferred examples of the water-soluble polymer having the functional group represented by the above formula (B) include a water-soluble polymer having a structural unit represented by the following formula (B-1):

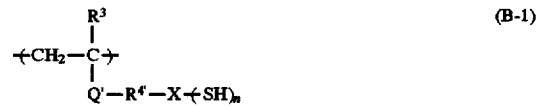

wherein $R^3$ has the same meaning as defined above; Q' and $R^{4'}$ have the same meanings as Q and $R^4$ defined above, respectively, or —Q'—$R^{4'}$ represents a divalent linking group such as an alkylene group, an allylene group, an aralkylene group, a COO group, a NHCOO group, a NHCOOCH$_2$CH$_2$ group, a CONH group and a substituent represented by the following formula (B-2):

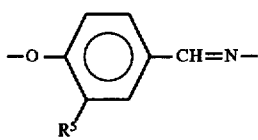

wherein $R^5$ represents a hydrogen atom or an alkoxy group preferably having 1 to 6 carbon atoms; and X and n have the same meanings as defined above.

$R^1$ in the above formula (A) represents a hydrogen atom; an alkyl group having 1 to 6 carbon atoms such as a methyl group, an ethyl group, a propyl group, a butyl group, etc.; a phenyl group; an amino group; or an amidino group; each of respective substituents other than the hydrogen atom may be substituted by an alkyl group preferably having 1 to 6 carbon atoms; preferably $R^1$ is a hydrogen atom or an amidino group.

$R^2$ in the formula (A) represents a hydrogen atom, an alkyl group or a substituted or unsubstituted amino group; preferably a hydrogen atom.

X in the formula (B) represents a nitrogen-containing heterocyclic substituent having a mercapto group, more specifically atomic groups necessary for formation of an oxadiazole ring, thiadiazole ring, selenadiazole ring, triazole ring, triazine ring, benzothiazole ring, etc., and these rings may be bonded via a benzene ring.

n in the formula (B) represents an integer of 1 or 2, preferably 1.

In the above formula (A-1) or (B-1), $R^3$ represents a hydrogen atom or an alkyl group having 1 to 6 carbon atoms such as a methyl group, an ethyl group, a propyl group, a butyl group, etc., preferably a hydrogen atom or a methyl group.

Q in the formula (A-1) or (B-1) represents a divalent linking group such as an alkylene group having 2 to 7 carbon atoms including a methylene group, an ethylene group, a propylene group, a butylene group, etc.; a phenylene group, an aralkylene group, a COO group, a NHCOO group, a NHCOOC$_2$H$_4$ group and a CONH group, preferably a methylene group, a phenylene group, an aralkylene group, a COO group and a CONH group; and Q may comprise a combination of two or more above linking groups.

$R^4$ in the formula (A-1) or (B-1) represents a divalent linking group selected from the group consisting of an alkylene group having 2 to 7 carbon atoms such as a methylene group, an ethylene group, a propylene group, a butylene group, etc.; an alkyleneoxy group having 2 to 7 carbon atoms such as a methyleneoxy group, an ethyleneoxy group, a propyleneoxy group, a butyleneoxy group, etc.; an oxyalkylene group having 2 to 7 carbon atoms such as an oxymethylene group, an oxyethylene group, an oxypropylene group, an oxybutylene group, etc.; and an arylene group such as a phenylene group, a naphthalene group, etc.; or a direct bonding arm; preferably a methyleneoxy group, a phenylene group or a direct bonding arm; or in the formula (B-1), —Q'—$R^{4'}$ represents a divalent linking group such as an alkylene group having 2 to 7 carbon atoms such as an ethylene group, a propylene group, a butylene group, etc., an allylene group, an aralkylene group having 1 to 6 alkylene carbon atoms, a COO group, a NHCCO group, a NHCOOCH$_2$CH$_2$ group, a CONH group and a substituent represented by the above formula (B-2) where $R^5$ represents a hydrogen atom or an alkoxy group preferably having 1 to 6 carbon atoms such as a methoxy group, an ethoxy group, a propoxy group, a butoxy group, etc., preferably a methoxy group. Also, $R^4$ may comprise a combination of two or more above divalent linking groups.

$R^5$ in the formula (B-2) is a hydrogen atom or an alkoxy group preferably having 1 to 6 carbon atoms such as a methoxy group, an ethoxy group, a propoxy group, a butoxy group, a heptoxy group and a hexoxy group, more preferably a hydrogen atom or a methoxy groups.

In the formula (A-1), the structural unit may be in the form of an acid addition salt such as a hydrochloride, hydrobromide, etc.

In the above formula (A-1), preferred examples of Q may include an alkylene group, an allylene group, a COO group, a NHCOO group, a CONH group and a NHCOOC$_2$H$_4$ group.

Specific examples of providing the structural unit represented by the formula (A-1) may include, for example, those obtained by polymerizing at least one of the monomers (a-1) to (a-12) as mentioned below.

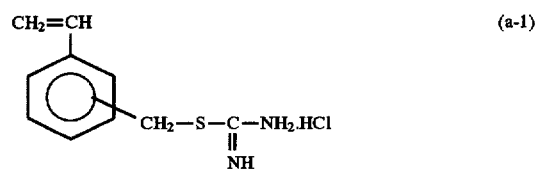

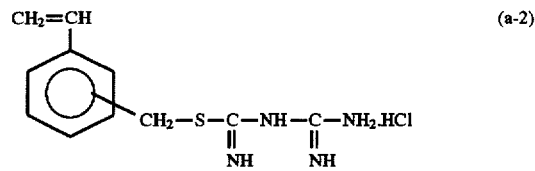

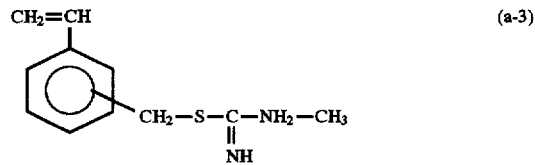

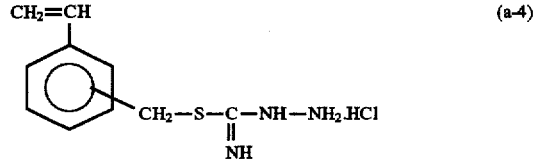

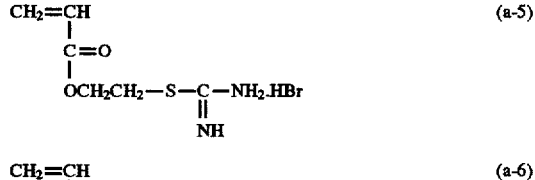

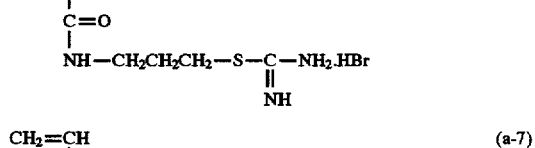

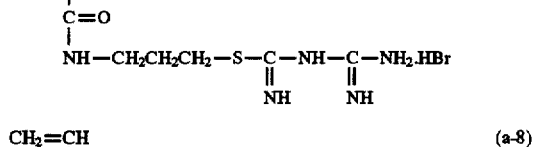

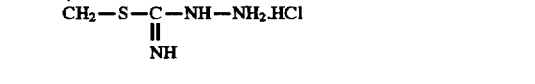

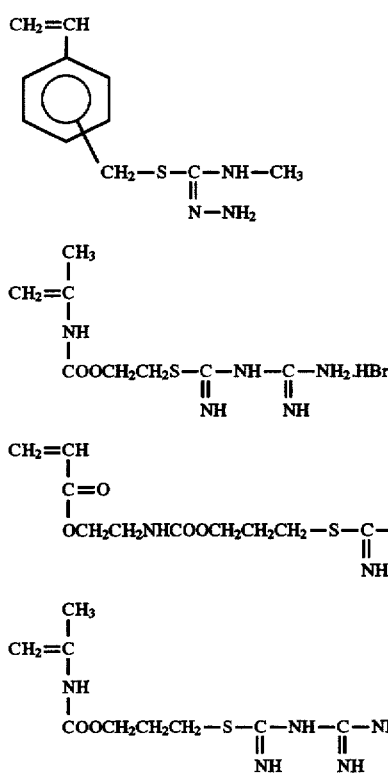

Specific examples of the structural unit represented by the formula (B-1) may include, for example, those obtained by polymerizing at least one of the monomers (b-1) to (b-12) as mentioned below. All of these monomers are monomers each having a mercapto group. When the monomer is polymerized as such, a polymer having a sufficient molecular weight may not be obtained or gelation may occur due to a chain transfer reaction of a polymerization radical to the mercapto group, whereby it is necessary to protect the mercapto group in a suitable form. For such a purpose, protection of the mercapto group on polymerization of the mercapto group can be carried out by a method in which polymerization is carried out after changing the mercapto group to the form of thiolate by adding various kinds of bases such as sodium hydroxide, potassium hydroxide and sodium carbonate, or a method in which polymerization is carried out after changing the mercapto group to the form of a thioester group as in acetylation. After completion of the polymerization, the mercapto group is regenerated merely by neutralizing the thiolate, and in the case of the thioester group, the mercapto group is regenerated by hydrolysis.

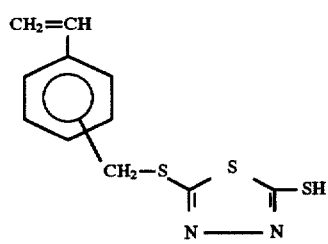

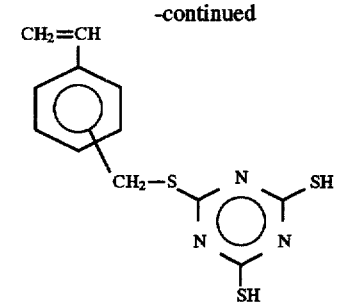

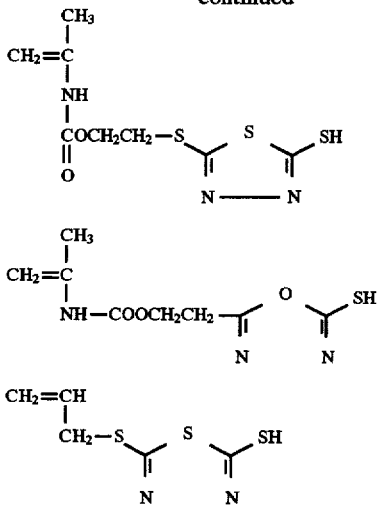

Further, as the water-soluble polymer, those having the structural unit represented by the above formula (A) (or (A-1)) or (B) (or (B-1)) as a functional group can be used whereby the effects of the present invention can be obtained. The water-soluble polymer may be a homopolymer of the monomer unit represented by the formula (A-1) or a copolymer with other monomer units. As the other structural units which can be introduced in the copolymer having the structural unit represented by the formula (A-1) of the present invention, there may be mentioned a structural unit represented by the formula (C):

wherein $R^6$ represents a hydrogen atom or a methyl group; $R^7$ represents a hydrogen atom or a methyl group; and $R^8$ represents a hydrogen atom, an alkyl group preferably having 1 to 6 carbon atoms or a hydroxyalkyl group preferably having 1 to 6 carbon atoms.

By incorporating such a structural unit represented by the formula (C), coating property can be improved as well as adhesiveness of the layer containing the water-soluble polymer to the support can be improved whereby a printing plate having good press life can be obtained.

Preferred examples of the monomer providing the structural unit represented by the formula (C) may include, for example, acrylamide, methacrylamide, N,N-dimethylacrylamide, N-isopropylacrylamide, N-methylolacrylamide, etc. By incorporating such a monomer in the water-soluble polymer as a component for the copolymer, the viscosity of the water-soluble polymer can be controlled suitably whereby coating property of a coating solution containing the polymer can be improved and a lithographic printing plate having good press life can be obtained.

The formulating ratio of the structural unit represented by the formula (A-1) or (B-1) and that of (C) in the copolymer is preferably 0.1% by weight to 100% by weight of (A-1) or (B-1) and the reminder being (C), more preferably 1 to 50% by weight of (A-1) or (B-1). In the above range, the effects of the present invention can be most effectively admitted. If the amount of (A-1) or (B-1) is less than 0.1 by weight, the effects of the present invention cannot sometimes be obtained.

The objects of the present invention can be accomplished by using the homopolymer having a functional group or a copolymer containing the structural unit as mentioned above, but depending on the respective cases, it is preferred to modify the characteristics of the water-soluble polymer. For example, in order to heighten hydrophobicity of the cured layer after chelate formation with a some extent and to improve ink receptivity on printing, the third or the fourth copolymerizable component, etc. such as various kinds of hydrophobic monomer including alkyl (meth)acrylate (saturated alkyl ester having from 1 to 20 carbon atoms, in the present specification, "(meth)acrylate" means acrylate or methacrylate), benzyl (meth)acrylate, styrene and derivatives thereof may be incorporated in the water-soluble copolymer. Or else, for other various purposes, there may be incorporated a monomer having a carboxyl group such as (meth)acrylic acid, crotonic acid, itaconic acid and maleic acid, or a salt thereof; a monomer having a sulfonic acid group such as sodium vinylsulfonate, sodium p-styrenesulfonate and sodium (meth)allylsulfonate; a monomer having a hydroxyl group such as 2-hydroxyethyl (meth)acrylate, hydroxypropyl (meth)acrylate and polyethyleneglycol mono(meth)acrylate; a monomer having a methoxy group and an ethyleneoxy group such as methoxyethyl (meth)acrylate, methoxypolyethyleneglycol mono (meth)acrylate and poly(ethyleneglycol)mono(meth) acrylate; a monomer having a basic nitrogen atom such as vinylimidazole, 4-vinylpyridine, 2-vinylpyridine, N,N-dimethylaminoethyl (meth)acrylate, N,N-diethylaminoethyl (meth)acrylate, N,N-dimethylaminopropyl acrylamide, allylamine and diallylamine; a vinyl ester derivative such as vinyl acetate, vinyl propionate and vinyl benzoate; N-vinylpyrrolidone; acrylonitrile; methyl vinyl ether; butyl vinyl ether, etc. Further, as a bifunctional monomer, a monomer such as divinylbenzene, ethyleneglycol di(meth) acrylate and methylenebisacrylamide may be incorporated with a small amount.

However, the content of the above monomers is preferably 50 by weight or less based on the total weight of the copolymer when the above monomers are to be incorporated into the water-soluble polymer. If the amount thereof exceeds the above range, disadvantages of lowering in water-solubility of the resulting polymer or worsening the degree of ink toning on printing will appear in some cases.

The molecular weight of the water-soluble polymer obtained by the present invention is preferably in the range of 5,000 to 1,000,000, more preferably 10,000 to 300,000 in terms of the weight average molecular weight (Mw). If the molecular weight exceeds the above range, the viscosity of the composition becomes high so that coating is sometimes difficult. On the other hand, if a polymer having a molecular weight lower than the above range is used to prepare a printing plate, press life thereof is sometimes lowered.

In order to utilize the water-soluble polymer in the present invention as a printing plate, selection of a support is important. For example, when the polymer is used as a printing plate for offset printing, indispensable requirements of a support are that its surface is sufficiently hydrophilic, and background toning on printing does not occur. As a support satisfying the above requirements, there may be suitably used an aluminum plate which is subjected to graining treatment and has a surface which is made hydrophilic by anodization. Or else, a film or polyethylene coated paper coated with a hydrophilic polymer can be also used as a support having a hydrophilic surface. Further, a film or polyethylene coated paper having a hydrophilic inorganic pigment such as silica and alumina sol in a surface layer thereof may be preferably used. By coating inorganic particles of zinc oxide or the like and various binding agents, if necessary, on a film, a polyethylene coated paper or a usual paper and subjecting the resulting material to suitable etching treatment in the same manner as in the system in which a zinc oxide photosensitive material to which the electrophotographic system is applied is utilized to prepare a printing plate, the surface of the support can be changed to a surface having hydrophilicity which can be used for offset printing.

The desired printing plate can be formed by coating the polymer of the present invention on each surface of various kinds of supports as described above. That is, the polymer of the present invention is characterized in that the polymer forms a chelate and is insolubilized by contact with metal ions. By coating the polymer of the present invention on the support having a surface previously subjected to treatment for imparting hydrophilicity as described above and injecting metal ions imagewisely from the surface of this polymer layer, chelate crosslinking of the polymer is generated imagewisely, and by removing the polymer at uncrosslinked portions by dissolution with water or the like, an image of the crosslinked polymer is formed on the support. Due to crosslinking, water absorption property (hydrophilicity) of the polymer is lowered and affinity for ink is exhibited so that the image portions become ink receptive and the hydrophilic surface is exposed at the non-image portions, whereby printing suitability for offset printing is exhibited.

The most important point of the present invention resides in that the crosslinked polymer film having ink receptivity imparted by chelate formation with a metal and insolubilization is formed on the hydrophilic surface of the support, and a method of feeding a heavy metal therefor is not particularly limited. In order to prove the effects of the present invention, a process in which an image is formed and a printing plate is prepared is specifically shown below, but the present invention is not limited by such a specific process.

As one example, a process for preparing a printing plate according to the ink jet recording system is described. In this process, the polymer of the present invention is coated on a support as described above, printing is carried out on the surface of the polymer layer by using an ink containing metal ions, and after printing, a recorded material is washed with water to obtain a printing plate that only printed portions remain on the support. When a substrate having a hydrophilic surface as described above is used as a support, printed portions are ink receptive and non-image portions are hydrophilic so that printing can be carried out by setting the resulting plate in an offset press. An indispensable component to be added to the ink on ink jet recording is a metal ion, and other components are not particularly required. However, in order to make the printed portions clear, various kinds of water-soluble dyes may be added suitably. Or else, a solvent such as various kinds of alcohols including ethanol, propanol, ethylene glycol and glycerin may be added for the purpose of preventing a recording head, a nozzle or the like from being clogged. As the metal ions, a salt containing various kinds of metal ions such as a silver ion, a copper ion, an iron ion and a palladium ion is particularly preferred, and various kinds of salts such as silver nitrate, copper sulfate, iron sulfate and palladium nitrate may be preferably used. Various kinds of metal ions other than the above metal ions may be preferably used so long as a chelate can be formed. The material of the recording head is particularly preferably a non-corrosive material such as glass in order to prevent corrosion by the metal ions.

As described above, the process for preparing a printing plate according to the ink jet recording system is extremely preferred in that a printing plate can be prepared extremely simply and easily by using an existing ink jet printer, and the recorded material can be used as a printing plate merely by removing the uncured polymer at the non-image portions by washing with water as a treating liquid. However, resolving power is influenced by the nozzle size of a head potion of the ink jet printer by which ink is scattered so that there is a disadvantage that when an ink jet printer having high resolving power is not used, only a printing plate with slightly poor resolving power can be obtained if it is a printing plate influenced by precision of a printer. Therefore, in such a printing plate using the ink jet recording system, a printing plate having high quality can be obtained by selecting precision of an ink jet printer depending on the purpose. When simple printing is acceptable, a usual ink jet printer can be selected and when high quality printing is required, an ink jet printer having a high resolving power shall be used.

As another specific example, there may be mentioned a system for feeding metal ions by utilizing the silver complex diffusion transfer system. In this system, an image-receiving sheet coated with the polymer of the present invention is prepared on a support as described above. On the other hand, a donor sheet coated with a silver complex photosensitive material is subjected to imagewise exposure. In the silver complex photosensitive material, a complex-forming material is contained and the material dissolves silver halide at the unexposed portion of the photosensitive material on development. Thus, the developed portions of the silver complex photosensitive material are chemically developed while silver halide at the unexposed portions forms a complex and is dissolved by a solvent (contrary to the case of a direct positive type silver halide photosensitive material). By superposing both of the sheets on development, silver ions can be transferred from the silver complex photosensitive material to the image-receiving sheet coated with the polymer. The polymer is cured simultaneously with transfer of the silver complex ions so that a cured film is formed only at portions to which the silver complex ions are transferred.

The process for preparing a printing plate utilizing the silver complex diffusion transfer process (DTR process), reference can be made, for example, André Rott and Edith Weyde, "Photographic Silver Halide Diffusion Processes", published by the Focal Press, London and New York (1972). As described therein, there have been known two types of lithographic printing plates utilizing the DTR process as mentioned above. Further, a lithographic printing plate of a silver complex system using an aluminum plate as a support is also known as mentioned above. In all of the types and the systems described above, portions receiving an ink on printing are metallic silver image portions formed by DTR development, and ink receptivity depends on the characteristics of metallic silver or the characteristics of various kinds of organic compounds carried on the surface the silver by adsorption. Therefore, there are problems that the silver image is not sufficiently adhered to the support, or press life, printed image quality and ink receptivity are lowered by influences such as abrasion of the silver image accompanied with increase in the number of printing.

With respect to these problems, in the above examples of the present invention, even when the above DTR process is utilized, the portion forming the image is the water-soluble polymer cured by metal ions, particularly silver ions. According to the classification described above, the plate belongs to the two sheet type plate. However, the DTR process is utilized merely as a system for feeding silver ions, and the image-forming process and mechanism and the element forming the image are different from those of a conventionally known process for preparing a lithographic printing plate according to the DTR process.

Modification of the process for preparing a printing plate utilizing the DTR process is a mono-sheet type lithographic printing plate. Indispensable requirements of a support are that its surface is sufficiently hydrophilic, and background toning on printing does not occur. As a support satisfying the above requirements, there may be suitably used an aluminum plate which is subjected to graining treatment and has a surface which is made hydrophilic by anodization. The thickness of the anodized layer is preferably in the range of about 0.3 to 3 μm. Further, it is preferred to subject the aluminum plate to desmutting prior to or immediately after anodization. That is, by treating the aluminum plate subjected to toughening treatment with 10 to 50% of hot sulfuric acid at 40° to 60° C. or an dilute alkali (sodium hydroxide or the like), smut attached to the surface is removed.

The desired printing plate can be formed by coating the polymer of the present invention and hydrophobic fine particles on the surface of the aluminum plate support as described above and further providing a photosensitive silver halide emulsion layer as an upper layer. That is, the polymer of the present invention is characterized in that the polymer forms a chelate and is insolubilized in contact with metal ions. By coating the polymer of the present invention on the support having a surface previously subjected to treatment for imparting hydrophilicity as described above and injecting metal ions imagewisely from the surface of this polymer layer, chelate crosslinking of the polymer is generated imagewisely, and by removing the polymer at uncrosslinked portions by dissolution with water or the like, an image of the crosslinked polymer is formed on the support. Due to crosslinking, water absorption property of the polymer is lowered and affinity for ink is exhibited so that the image portions become ink receptive and the hydrophilic surface is exposed at the non-image portions, whereby printing suitability for offset printing is exhibited.

In all of the above DTR processes, the silver complex ions from the silver halide emulsion layer are utilized as a means for feeding metal ions imagewisely to the layer containing the polymer. By carrying out the above DTR development as a development system, non-photosensitive silver halide at unexposed portions is dissolved by a suitable solvent (contrary to the case of a direct positive type silver halide photosensitive material) and diffused in the layer containing the water-soluble polymer to cure the polymer layer, whereby portions which are cured imagewisely are formed. As the solvent for dissolving silver halide at unexposed portions by complex formation, there may be used various solvents including various kinds of amine compounds, sodium thiosulfate, ammonium thiosulfate, thiocyanate, cystine, a mercapto compound such as mercaptoacetic acid and thioethers.

In the support having the water-soluble polymer layer thereon imagewisely cured by the silver complex ions on development obtained by the process as mentioned above, the untransferred portions, or further the silver halide emulsion layer can be removed by washing with water whereby an image pattern is formed by the cured polymer on the support. The surface of the support itself has hydrophilicity as described above, whereby the resulting printing plate can be used as such as a printing plate for offset printing.

In the two sheet type printing plate, an image-receiving sheet material coated with the polymer having an image cured by transferred silver ions is used as a printing plate. Therefore, there is an advantage that designs of characteristics of a photosensitive silver halide photographic material can be carried out irrespectively of the characteristics required as a printing material. The printing plate itself basically comprises a support and a layer of the water-soluble polymer, and its design is simple and the printing plate itself does not have photosensitivity so that handling is easy and there is an advantage in cost.

In the image-receiving sheet material to which the silver ions are transferred on development by the process as described above, the untransferred portions are removed by washing with water to form an image pattern by the cured polymer on the support, and the surface of the support itself has hydrophilicity as described above, whereby the resulting printing plate can be used as such as a printing plate for offset printing.

Or else, in the process for forming a printing plate based on the above principle, the polymer according to the present invention and metallic nuclei for physically developing silver complex ions transferred from a silver complex photosensitive material may be contained in combination. For example, by incorporating the so-called physical development nuclei such as metallic silver nuclei or palladium nuclei (palladium sulfate or the like) in a layer containing the polymer or a layer adjacent to said layer, the curing reaction of the polymer by transfer of the silver complex ions is occurred simultaneously with the formation of metallic silver on the sheet containing the polymer accompanied with the progress of physical development. Existence of such metallic silver is preferred since ink receptivity of the cured polymer at the image portions is further heightened, and said existence is extremely preferred since the image portions are colored in black to make the image on the printing plate clear.

For forming a layer containing the above physical development nuclei, it is preferred to use a solution in which the physical development nuclei are dispersed in a colloidal state as a coating solution and spread the solution. For example, it is preferred to use colloidal gold or silver, and colloidal metal sulfide obtained by mixing a water-soluble salt such as palladium, zinc or the like with sulfide. As a protective colloid for maintaining the colloidal state stably, gelatin and various kinds of water-soluble polymers may be used. Particulars and preparation processes thereof are described in, for example, André Rott and Edith Weyde, "Photographic Silver Halide Diffusion Processes", published by the Focal Press, London and New York (1972) described above.

The colloid dispersion containing the physical development nuclei prepared as described above may be mixed with the water-soluble polymer of the present invention and coated on the aluminum support to effect film formation, or a layer of the physical development nuclei may be directly provided on the aluminum support, followed by forming a layer containing the water-soluble polymer. Or else, a layer containing the water-soluble polymer may be previously provided, followed by providing a layer of the physical development nuclei. In all of the layer structures, in the mono-sheet type, a photosensitive silver halide emulsion layer is further formed as an upper layer thereof to prepare a printing plate. In all of the layer structures, the respective properties as a printing plate are almost the same.

In the photosensitive silver halide emulsion layer of the present invention, various water-soluble polymers may be used. For example, various kinds of gelatins such as acid-treated gelatin, alkali-treated gelatin, a gelatin derivative and a grafted gelatin, polyvinyl pyrrolidone, various kinds of starches, albumin, polyvinyl alcohol, gum arabic, various kinds of cellulose derivatives such as hydroxyethyl cellulose and various kinds of polymers such as poly(meth)acrylic acid and poly(meth)acrylate may be used singly or in combination. However, in order to peel off the silver halide emulsion layer containing such a polymer after physical development, a non-crosslinked silver halide emulsion layer substantially containing no hardening agent is preferred.

As the photosensitive silver halide emulsion according to the present invention, preferred is an emulsion selected from generally used silver chloride, silver bromide, silver iodide, silver chlorobromide, silver chloroiodobromide and silver iodobromide. The type of the emulsion may be either a negative type or a positive type, and the emulsion is preferably chemically sensitized or spectrally sensitized, if necessary.

The developing agent may be contained in either or both of the photosensitive material or/and the developer in the development processing of a usual photosensitive silver halide photographic material. The development processing of the present invention can be carried out according to the conventional manner and the developing speed can be controlled.

The developing agent to be used in the present invention may be mentioned, for example, the hydroxybenzene type such as hydroquinone, catechol and pyrogallol, and derivatives thereof such as methylhydroquinone, dimethylhydroquinone, chlorohydroquinone, 4-methylcatechol, 4-ethylcatechol, 4-t-butylcatechol, gallic acid, methyl gallate, ethyl gallate, etc.; p-aminophenol and derivatives thereof such as N-methyl-p-aminophenol, 2,4-diaminophenyl sulfate, etc.; and 1-phenyl-3-pyrazolidone and 1-phenyl-4-methyl-3-pyrazolidone, etc. These developing agents are applied as an aqueous solution or as a solution in a water-miscible organic solvent such as methanol, ethanol, propanol, acetone, ethylene glycol, etc. The solution containing a developing agent is applied preferably together with a solution containing colloidal heavy metals or colloidal heavy metal sulfides.

The sufficient amount of the developing agent to be applied is, for example, 0.02 g/m$^2$ to 1.0 g/m$^2$ for hydroquinone and 0.001 g/m$^2$ to 0.1 g/m$^2$ for 1-phenyl-3-pyrazolidone. The photosensitive material obtained by use of a developing agent of the present invention is improved in toning on printing and has advantages of high contrast in photographic image as well as in printing characteristics, desirable sharpness of the image, excellent resolving power and little variation in properties with the lapse of time.

When a sheet material in which the polymer of the present invention is coated on a support is prepared as a printing plate, the amount of the polymer to be coated for forming a film is in the range of 0.1 to 10 g/m$^2$ in terms of dry weight. If the amount to be coated is less than the above range, ink receptivity on printing is insufficient and press life is poor in some cases. If the amount exceeds the above range, resolving power is poor in some cases. Thus, it is desirable to use a sheet material formed by coating the polymer in an amount in the above range as a printing plate.

The water-soluble polymer of the present invention can be manufactured by the common radical polymerization. As the polymerization solvent, in addition to water alone, various kinds of alcohols or the like which are miscible with water can be preferably used in combination with water in order to control the polymerization degree suitably.

The polymer of the present invention can be used in combination with at least one of various kinds of water-soluble polymers such as gelatin, polyvinyl alcohol, polyvinylpyrrolidone, hydroxyethyl cellulose, carboxymethyl cellulose, poly(meth)acrylamide, poly(meth)acrylic acid, poly(meth)acrylate, dextran, pullulan, various kinds of modified starch, etc. However, various kinds of the water-soluble polymers described above are required to be added within the range which does not impair curing property of the film and are preferably used in amounts equivalent to or less than the amount of the polymer of the present invention.

When various kinds of pigments such as particles of silica particles, carbon black, colloidal silica, alumina sol or the like are added as a filler in combination with the polymer of the present invention, effects of accelerating permeation and diffusion of the solution containing the silver complex ions into the layer containing the above filler can be sometimes obtained.

This invention is characterized in that a specific polymer is contained in a metal ion image-receiving layer, and thus, no restriction is placed on other features of the printing element such as type of the support, system of ink jet recording, type of the photosensitive silver halide photographic material, procedure of silver complex diffusion transfer treatment, etc.

Next, polymers having functional groups according to the present invention are exemplified but the present invention is not limited by these examples. The numerals in the formulae represent % by weight of the recurring unit in the copolymer composition.

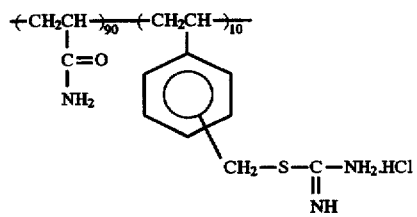

(P-1)

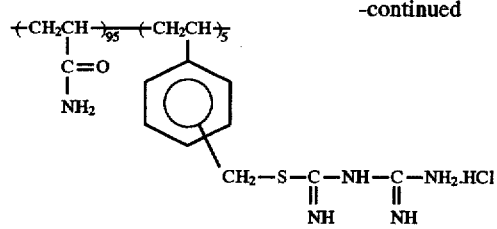
(P-2)
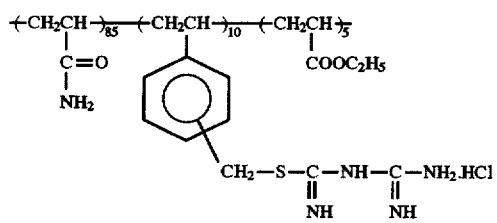
(P-3)
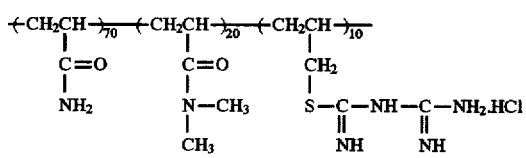
(P-4)
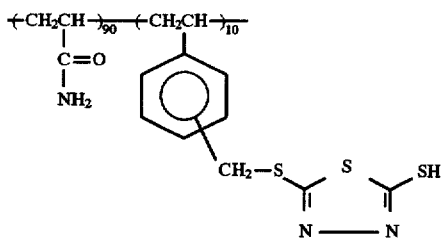
(P-5)
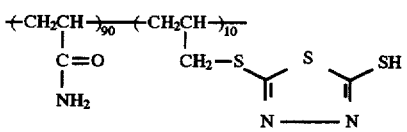
(P-6)
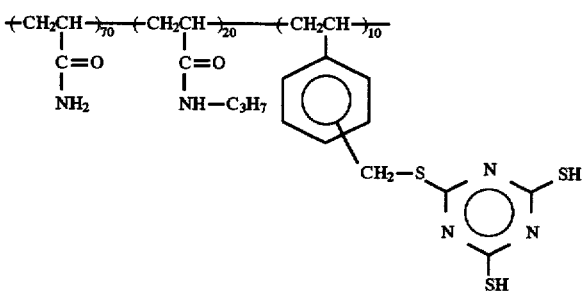
(P-7)
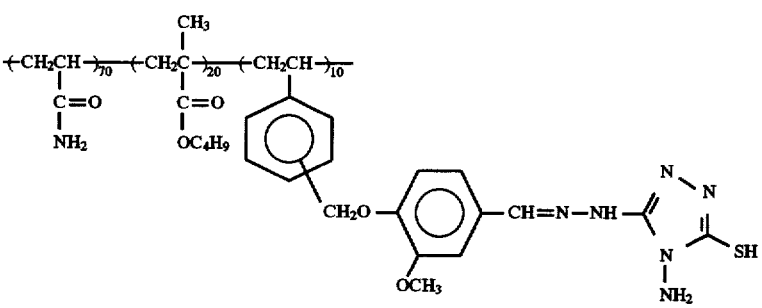
(P-8)

EXAMPLES

The present invention is described in detail by referring to Examples.

Example 1

(I) Synthesis of Polymer
Synthetic example 1 (Exemplary polymer P-1)

To a 500 ml four-necked flask equipped with a stirrer, a thermometer, a reflux tube and a nitrogen introducing tube were charged 45 g of acrylamide and 5 g of (a-1) (which was synthesized from thiourea and chloromethylstyrene (mixture of m- and p-isomers) in ethanol under reflux. Similarly, the compound (a-2) was synthesized from guanylthiourea and chloromethylstyrene, and others (a-3) to (a-8) were also synthesized in the same manner except for using the corresponding starting materials.), and then 200 g of distilled water and 100 g of ethanol were added thereto to dissolve the mixture. The flask was placed on a water bath heated to 50° C., and under nitrogen stream and stirring, 0.5 g of 2,2'-azobis(2-aminodipropane)dihydro chloride (V-50, trade name, available from Wako Junyaku K.K.) was added to the mixture as a polymerization initiator to start the polymerization. Stirring was carried out at 50° C. for one hour and stirring was further continued by raising the inner temperature of the flask to 75° C. for 3 hours. The polymer thus obtained had a weight average molecular weight of about 100,000 as a result of GPC analysis. According to completely the same procedure as mentioned above, the polymers shown as (P-2) to (P-4) were synthesized.

Synthetic example 2 (Exemplary polymer P-5)

To a 500 ml four-necked flask equipped with a stirrer, a thermometer, a reflux tube and a nitrogen introducing tube were charged 45 g of acrylamide and 5 g of (b-1) (which was synthesized from bismuthiol(2,5-dimercapto-1,3,4-thiadiazole) and chloromethylstyrene (mixture of m- and p-isomers) in water/ethanol in the presence of an equimolar amount of sodium hydroxide under heating. Similarly, the compound (b-2) was synthesized from monosodium thiocyanurate and chloromethylstyrene, and others (b-3) to (b-8) were also synthesized in the same manner except for using the corresponding starting materials.), and then 0.78 g of sodium hydroxide, 200 g of distilled water and 100 g of ethanol were added thereto to dissolve the mixture. The flask was placed on a water bath heated to 50° C., and under nitrogen stream and stirring, 0.5 g of 2,2'-azobis(2,4-dimethylvaleronitrile) (V-65, trade name, available from Wako Junyaku K.K.) was added to the mixture as a polymerization initiator to start the polymerization. Stirring was carried out at 50° C. for one hour and stirring was further continued by raising the inner temperature of the flask to 5° C. for 3 hours. The polymer thus obtained had a weight average molecular weight of about 100,000 as a result of GPC analysis. According to completely the same procedure as mentioned above, the polymers shown as (P-6) to (P-8) were synthesized.

(II) Preparation of lithographic printing plate

A gelatin solution containing carbon black was coated on a sheet of polyethylene coated paper with 135 g/m² which had been subjected to corona discharge treatment. Then, an orthochromatically sensitized high-contrast silver halide emulsion was coated over the gelatin coating. The emulsion layer was composed essentially of 1.5 g/m² of silver halide in terms of silver nitrate and 1.5 g/m² of gelatin, and contained formalin and dimethylolurea as hardening agents. The above photosensitive silver halide photographic material was processed for 3 days at 40° C.

Separately, on an aluminum plate which had been subjected to graining treatment and had a surface which was made hydrophilic by anodization, the polymer shown as (P-2) as the polymer of the present invention was coated so as to have a dry weight of 2 g/m², whereby an image-receiving sheet was prepared. This image-receiving sheet was defined as Plate (A). Further, a coating solution was prepared by formulating the polymer (P-2) as the polymer of the present invention and palladium sulfate sol prepared as described above according to the prescription shown in (2). Similarly, on the aluminum plate treated in the same manner as mentioned above, the coating solution was coated so that the dry weight of the polymer (P-2) was 2 g/m², whereby Plate (B) was prepared.

(1) Preparation of palladium sulfate sol

| Solution A: | |
|---|---|
| Palladium chloride | 5 g |
| Hydrochloric acid | 40 ml |
| Distilled water | 1000 ml |
| Solution B: | |
| Sodium sulfide | 8.6 g |
| Distilled water | 1000 ml |

The solutions A and B were mixed with stirring. After 30 minutes, the resulting mixture was passed through a column packed with an ion-exchange resin (IR-120E, IRA-400, both trade names, available from Rohm & Haas Co.) to obtain a palladium sulfate sol.

(2) Preparation of physical development nuclei coating solution containing the polymer of the present invention

| | |
|---|---|
| The above palladium sulfate sol | 100 ml |
| Hydroquinone | 100 g |
| Polymer of the present invention | |
| (as a solid component) | 50 g |
| 10% Saponin (Surfactant) | 2 ml |
| Make up to 2000 ml with addition of water. | |

(III) Processing

The photosensitive silver halide material obtained above was exposed in accordance with an image, superposed on the above Plate (A) or (B) so that the material and Plate (A) or (B) faced to each other and a liquid would be permeated between them, and immersed into a transfer developer (C) of the following prescription at 30° C. for 30 seconds to carry out transfer development. The sheet of the photosensitive silver halide photographic material was peeled off, and Plate (A) or (B) was subsequently immersed in a solution of the following prescription (D) at 25° C. for 30 seconds, further immersed in running water to wash away the polymer at the uncured portions sufficiently, then squeezed to remove excess water and air-dried under atmospheric conditions.

| Prescription (C) (Transfer developer) | |
|---|---|
| Water | 1500 ml |
| Sodium hydroxide | 20 g |
| Sodium sulfite | 100 g |
| Hydroquinone | 12 g |
| 1-Phenyl-3-pyrazolidone | 1 g |
| Sodium thiosulfate | 10 g |
| Potassium thiocyanate | 5 g |

-continued

| Potassium bromide | 5 g |
| --- | --- |
| Make up the total volume to 2 liters with addition of water. | |

| Prescription (D) | |
| --- | --- |
| Water | 2 liters |
| Citric acid | 10 g |
| Sodium citrate | 35 g |

(IV) Printing

The printing plates (Plate (A) and Plate (B)) thus prepared were mounted on an offset press (Ryobi 3200 CD (OFFSET DUPLICATOR), trade name, manufactured by Ryobi Limited), and the plates were used in printing. The printing room was at a temperature of 22° C. and a relative humidity of 60%.

For damping, a commercially available damping water was used, and for the printing ink, "F Gloss Sumi B" (trade name, available from Dainippon Ink Inc.) was used.

(VI) Evaluation in printing characteristics

Next, by using the printing plates obtained as mentioned above, printing was carried out by the aforesaid offset press according to the predetermined procedure. Evaluation of the printing characteristics was conducted by judging the degree of toning on printing of the printed material with eyes. Further, as evaluation of press life, printing of 100,000 sheets was carried out under the same conditions and then evaluated. As the results, all of the printing plates did not suffer from background toning and showed that they can carry out printing without any problem.

Example 2

In the same manner as in Example 1, plates were prepared by coating the polymers shown as (P-1) to (P-8) on the same aluminum plate so as to have a dry weight of 2 g/m², respectively. By using an ink jet printer (IO-735, trade name, available from Sharp Co.) and an ink of the following prescription (E), test patters were printed on the plates. The printed plates were immediately washed with running water to wash away the polymers at the non-printed portions, whereby the respective printing plates were obtained.

| Prescription (E) | |
| --- | --- |
| Water | 100 ml |
| Copper sulfate | 3 g |
| Acid Blue 9 (CI-42090) | 1 g |
| Ethylene glycol | 10 g |

Next, by using the printing plates obtained as mentioned above, printing was carried out by the aforesaid offset press in the same manner as in Example 1. Evaluation of the printing characteristics was conducted by judging the degree of toning on printing of the printed material with eyes. Further, as the evaluation of press life, printing of 100,000 sheets was carried out under the same conditions and then evaluated. As the results, all of the printing plates did not suffer from background toning and showed that they can carry out printing without any problem.

Example 3

On the surface of a commercially available zinc oxide plate (ZM Master, trade name, available from Mitsubishi Paper Mills, Ltd.) as a master for an offset printing plate according to the electrophotographic system, the polymers (P-1) to (P-8) were coated so as to have a dry weight of 1.5 g/m², respectively. In completely the same manner as in Example 2, printing was carried out by using the ink jet printer. The ink of the above prescription (E) was used as an ink. The plates after printing were washed sufficiently with running water and then subjected to etching treatment using an etching solution (ZM-OH, trade name, available from Mitsubishi Paper Mills, Ltd.) for a zinc oxide master, and the respective surface zinc oxide layers were subjected to treatment for imparting hydrophilicity.

Next, by using the printing plates obtained as mentioned above, printing was carried out by the aforesaid offset press in the same manner as in Example 1. Evaluation of the printing characteristics was conducted by judging the degree of toning on printing of the printed material with eyes. Further, as the evaluation of press life, printing of 5,000 sheets was carried out under the same conditions and then evaluated. As the results, all of the printing plates did not suffer from background toning and showed that they can carry out printing without any problem.

Example 4

(I) Preparation of lithographic printing plate

On an aluminum plate which was subjected to graining treatment and had a surface which was made hydrophilic by anodization, the polymer shown as (P-2) as the polymer of the present invention and polystyrene beads (which were monodispersed fine particles having a particle size of 1 μm, synthesized by the known dispersion polymerization process and added in an amount of 5% by weight based on the amount of the polymer (P-2)) were coated so as to have a dry weight of 2 g/m², whereby an image-receiving sheet was prepared. This image-receiving sheet was defined as Plate (A'). Further, a coating solution was prepared by formulating the polymer (P-2) of the present invention, the polystyrene beads having a particle size of 1 μm (added in an amount of 5% by weight based on the amount of the polymer (P-2)) and palladium sulfate nuclei prepared according to Example 1. Similarly, on the aluminum plate, the coating solution was coated so that the total dry weight of the polymer (P-2) and the polystyrene beads was about 2 g/m², whereby Plate (B') was prepared. Further, on the respective plates, an orthochromatically sensitized high-contrast silver halide emulsion was coated as an upper layer. The emulsion layer was composed essentially of 1.5 g/m² of silver halide in terms of silver nitrate and 1.5 g/m² of gelatin, and did not contain a hardening agent.

(II) Processing

Plate (A') or (B') obtained as described above was subjected to image exposure and immersed into the transfer developer (C) of Example 1 at 30° C. for 30 seconds to carry out transfer development. The sheet of the photosensitive silver halide photographic material was peeled off. Plate (A') or (B') was subsequently immersed in the solution of the prescription (D) of Example 1 at 25° C. for 30 seconds, further immersed in running water to wash away the polymer and the silver halide emulsion layer at the uncured portions sufficiently, then squeezed to remove excess water, air-dried and further heated in an oven at 100° C. for 10 minutes.

(III) Printing

The printing plates (Plate (A') and Plate (B')) thus prepared were mounted on an offset press (Ryobi 3200 CD (OFFSET DUPLICATOR), trade name, manufactured by Ryobi Limited), and the plates were used in printing. The printing room was at a temperature of 22° C. and a relative humidity of 60%.

For damping, a commercially available damping water was used, and for the printing ink, "F Gloss Sumi B" (trade name, available from Dainippon ink inc.) was used.

(IV) Evaluation in printing characteristics

Next, by using the printing plates obtained as mentioned above, printing was carried out by the aforesaid offset press according to the predetermined procedure. Evaluation of the printing characteristics was conducted by judging the degree of toning on printing of the printed material with eyes. Further, as the evaluation of press life, printing of 100,000 sheets was carried out under the same conditions and then evaluated. As the results, all of the printing plates did not suffer from background toning and showed that they can carry out printing without any problem.

Example 5

In the same manner as in Example 4, plates were prepared by coating the polymers shown as (P-1) to (P-8) and a polystyrene type latex synthesized by emulsification polymerization in the presence of a nonionic surfactant according to the known method (added in an amount of 10% by weight based on the amount of the polymer) on the same aluminum plate so as to have a dry weight of 2 g/m², respectively. The same silver halide emulsion layer as in Example 4 was further provided on the respective plates. The plates were subjected to image exposure, developed by the transfer developer shown in Example 1. Immediately after development, the plates were washed with running water to wash away the polymers at the uncured portions and the emulsion layers, and dried by heating at 70° C. for 10 minutes to obtain respective printing plates.

Next, by using the printing plates obtained as mentioned above, printing was carried out by the aforesaid offset press in the same manner as in Example 1. Evaluation of the printing characteristics was conducted by judging the degree of toning on printing of the printed material with eyes. Further, as the evaluation of press life, printing of 100,000 sheets was carried out under the same conditions and then evaluated. As the results, all of the printing plates did not suffer from background toning and showed that they can carry out printing without any problem.

Example 6

After hydrosol of reduced silver was coated on the aluminum plate support of Example 4, the polymers (P-1) to (P-8) and an acrylic latex (which was a latex comprising poly(ethyl acrylate) as a main component, synthesized by using a non-ionic surfactant according to the known method and added in an amount of 20% by weight based on the amount of the polymer) were coated on the support to have a dry weight of 1.2 g/m² and dried, respectively. Further, the same silver halide emulsion layer as in Example 4 was formed on the respective plates. The resulting plates were subjected to image exposure and development by using the DTR developer described in Example 1 of Japanese Provisional Patent Publication No. 282295/1992. Immediately after development, the plates were washed with water to wash away the polymers at the uncured portions and the emulsion layers. Thereafter, the respective plates were dried by heating at 50° C. for 5 minutes.

Next, by using the printing plates obtained as mentioned above, printing was carried out by the aforesaid offset press in the same manner as in Example 1. Evaluation of the printing characteristics was conducted by judging the degree of toning on printing of the printed material with eyes. Further, as the evaluation of press life, printing of 100,000 sheets was carried out under the same conditions and then evaluated. As the results, all of the printing plates did not suffer from background toning and showed that they can carry out printing without any problem.

I claim:

1. A process for preparing a printing plate which comprises the steps of providing, on a support, a layer containing a water-soluble polymer which becomes water-insoluble by a metal ion, and feeding the metal ion imagewisely from the surface of the layer to form an image pattern comprising a water-insoluble polymer on a support wherein said water-soluble polymer is a chelate forming polymer having a functional group which becomes water-insoluble by interaction with a metal ion.

2. A process for preparing a printing plate which comprises the steps of providing, on a support, a layer containing a water-soluble polymer which becomes a water-insoluble polymer in the presence of a metal ion and having a functional group represented by the following formula (A) or (B),

wherein $R^1$ represents a hydrogen atom, an alkyl group, an aryl group, an amino group or an amidino group; and $R^2$ represents a hydrogen atom or an amino group;

wherein X represents a nitrogen-containing hetero-cyclic ring; and n represents an integer of 1 or 2, feeding a solution containing the metal ion imagewisely from the surface of the layer containing a water-soluble polymer to change the water-soluble polymer to water-insoluble by formation of a chelate; and removing soluble portions of the water-soluble polymer by dissolution to form a hardened image pattern comprising the water-insoluble polymer on the support.

3. The process according to claim 2, wherein the method of feeding the metal ion imagewisely is a silver complex diffusion transfer method.

4. The process according to claim 3, wherein a photosensitive silver halide emulsion layer is provided on the layer containing a water-soluble polymer.

5. The process according to claim 2, wherein the water-soluble polymer contains as a structural unit at least one selected from the group consisting of a unit represented by the formula (A-1):

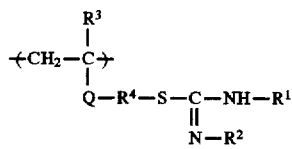

(A-1)

wherein R³ represents a hydrogen atom or a lower alkyl group having 1 to 6 carbon atoms; Q represents a divalent linking group; R⁴ represents a divalent linking group or a direct bonding arm; and R¹ and R² have the same meanings as defined in claim 2;

and a unit represented by the following formula (B-1):

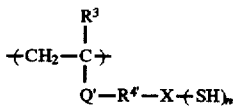

(B-1)

wherein R³ has the same meaning as defined above; Q' and R⁴' have the same meanings as Q and R⁴ defined above, respectively, or —Q'—R⁴' represents a divalent linking group A2 an alkylene group, an allylene group, an aralkylene group, a COO group, a NHCOO group, a NHCOOCH₂CH₂ group, a CONH group and a substituent represented by the formula (B-2):

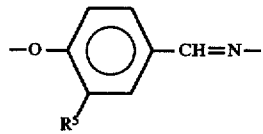

(B-2)

wherein R⁵ represents a hydrogen atom or an alkoxy group having 1 to 6 carbon atoms;

and X and n have the same meanings as defined in claim 2.

6. The process according to claim 5, wherein the water-soluble polymer further comprises a structural unit represented by the formula (C):

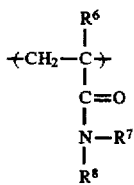

(C)

wherein R⁶ represents a hydrogen atom or a methyl group; R⁷ represents a hydrogen atom or a methyl group; and R⁸ represents a hydrogen atom, an alkyl group having 1 to 6 carbon atoms or a hydroxyalkyl group having 1 to 6 carbon atoms.

7. The process according to claim 2, wherein the layer containing a water-soluble polymer contains physical development nuclei.

8. The process according to claim 4, wherein a layer containing physical development nuclei is further provided between the layer containing a water-soluble polymer and the photosensitive silver halide emulsion layer.

9. A process for preparing a printing plate which comprises the steps of providing, on a support, a layer containing a water-soluble polymer which becomes water-insoluble by a heavy metal ion, and feeding the metal ion imagewisely from the surface of the layer to form an image pattern comprising a water-insoluble polymer on the support, said metal ion being fed by an ink jet recording system having an ink component containing said metal ion, and wherein said water-soluble polymer is a chelate forming polymer having a functional group which becomes water-insoluble by interaction with the metal ion.

* * * * *